US 6,663,469 B2

(12) United States Patent
Kimura et al.

(10) Patent No.: US 6,663,469 B2
(45) Date of Patent: Dec. 16, 2003

(54) POLISHING METHOD AND APPARATUS (75) Inventors: Norio Kimura, Kanagawa (JP); Tatsuya Kohama, Kanagawa (JP)

(73) Assignee: Ebara Corporation, Tokyo (JP)

( * ) Notice: Subject to any disclaimer, the term of this patent is extended or adjusted under 35 U.S.C. 154(b) by 22 days.

(21) Appl. No.: 09/870,479

(22) Filed: Jun. 1, 2001

(65) Prior Publication Data

US 2002/0002029 A1 Jan. 3, 2002

(30) Foreign Application Priority Data

Jun. 2, 2000 (JP) ........................................ 2000-166682

(51) Int. Cl.⁷ ................................................ B24B 7/19
(52) U.S. Cl. ................................ 451/41; 451/5; 451/8; 451/11; 451/37; 451/36; 451/288
(58) Field of Search .......................... 451/11, 8, 5, 41, 451/37, 36, 57, 285–288

(56) References Cited

U.S. PATENT DOCUMENTS

| | | | | |
|---|---|---|---|---|
| 5,660,672 A | * | 8/1997 | Li et al. ................. | 156/345.13 |
| 6,027,398 A | * | 2/2000 | Numoto et al. ............. | 451/285 |
| 6,066,030 A | * | 5/2000 | Uzoh .......................... | 451/41 |
| 6,072,313 A | * | 6/2000 | Li et al. ..................... | 324/230 |
| 6,190,234 B1 | * | 2/2001 | Swedek et al. ................ | 451/6 |
| 6,224,460 B1 | * | 5/2001 | Dunton et al. ................ | 451/6 |
| 6,247,998 B1 | * | 6/2001 | Wiswesser et al. ............ | 451/6 |
| 6,254,457 B1 | * | 7/2001 | Perrin et al. ................... | 451/41 |
| 6,261,157 B1 | | 7/2001 | Bajaj et al. | |
| 6,261,158 B1 | * | 7/2001 | Holland et al. ................ | 451/63 |
| 6,283,822 B1 | * | 9/2001 | Togawa et al. ................ | 451/5 |
| 6,402,589 B1 | * | 6/2002 | Inaba et al. ..................... | 451/5 |
| 6,425,801 B1 | * | 7/2002 | Takeishi et al. ............... | 451/5 |
| 6,433,541 B1 | * | 8/2002 | Lehman et al. ............. | 324/230 |
| 6,515,493 B1 | * | 2/2003 | Adams et al. .............. | 324/716 |
| 6,558,229 B2 | * | 5/2003 | Kimura et al. ................. | 451/8 |
| 6,595,831 B1 | * | 7/2003 | Hirokawa et al. ............. | 451/36 |

FOREIGN PATENT DOCUMENTS

| | | |
|---|---|---|
| JP | 2001274126 | 10/2001 |
| JP | 2001338902 | 12/2001 |

* cited by examiner

Primary Examiner—Lee D. Wilson
(74) Attorney, Agent, or Firm—Wenderoth, Lind & Ponack, L.L.P.

(57) ABSTRACT

A semiconductor substrate having a Cu layer formed so as to fill wiring grooves formed in the substrate surface and to cover regions of the substrate surface where no wiring groove is formed is brought into sliding contact with a polishing surface on a turntable to carry out polishing until the Cu layer is polished to a predetermined thickness. Then, the semiconductor substrate is brought into sliding contact with a polishing surface on a turntable to carry out polishing until the Cu layer on the substrate surface is removed, except for portions of the Cu layer formed to fill the wiring grooves, and a barrier metal layer is also removed. Thus, the Cu layer on the substrate surface can be removed uniformly, and the Cu wiring portions formed in the wiring grooves can be planarly and uniformly polished without giving rise to problems of over-polishing such as dishing or erosion.

30 Claims, 9 Drawing Sheets

POLISHING METHOD AND APPARATUS

BACKGROUND OF THE INVENTION

The present invention relates to a polishing method and apparatus. More particularly, the present invention relates to a polishing method and apparatus wherein a Cu layer formed on a substrate is polished by a chemical and mechanical polishing (CMP) process, in the case that Cu (copper) wiring is to be formed on the substrate, e.g. a semiconductor wafer.

Conventionally, to form circuit wiring patterns or interconnections in a semiconductor substrate, a conductor film is deposited on the substrate surface by using sputtering or other similar process, and then unnecessary portions of the film are removed by chemical dry etching using a pattern mask, e.g. a resist pattern mask.

As a material for forming circuit wiring patterns, aluminum (Al) or an aluminum alloy is generally used. However, as the degree of integration of semiconductor devices increases, wiring patterns are becoming smaller and finer, resulting in an increase in current density, with a consequent increase in thermal stress and temperature. Such a phenomenon becomes more pronounced as Al or other films for wiring patterns are made thinner due to resulting problems of stress migration and electromigration, and there is a possibility that wiring patterns may become disconnected or short-circuit.

Accordingly, it is necessary for a material having higher electric conductivity, such as copper, to be employed in forming wiring patterns, to thereby avoid excessive heat generation during energization thereof. However, copper and copper alloys are difficult to etch using conventional dry etching processes. Therefore, it is difficult to adopt the above-described method, in which patterns are formed after a film has been deposited on the entire substrate surface. In view of this problem, there has been considered adoption of a process by which the substrate surface is preformed with grooves in a predetermined pattern for wiring, and then copper or a copper alloy is filled into the grooves. This method makes redundant the process for removing unnecessary portions of the film by etching, and it is necessary only to carry out a polishing process for removing steps on the surface after the grooves have been filled with copper or a copper alloy. Further, the latter mentioned process is advantageous in that it is possible to form simultaneously wiring holes for interconnection between upper and lower layers of a multilayer circuit.

However, the aspect ratio (i.e. the ratio of the depth to the diameter or the width) of such wiring grooves or wiring holes has become high as the line width of wiring patterns has become increasingly fine. As a result, it is difficult to fill uniformly such wiring grooves or wiring holes with a metal by using a sputtering process. Meanwhile, a process which is used generally as a method for deposition of various materials exists which is known as chemical vapor deposition (CVD). In the case of copper or a copper alloy, however, it is difficult to prepare an appropriate gas material for the CVD process. In addition, when an organic material is employed, carbon (C) may become mixed in with the deposited film, causing an undesirable increase in migration problems.

Under these circumstances, a method has been proposed in which a substrate is dipped in a plating solution and subjected to electroless plating or electroplating of copper (Cu), and thereafter, unnecessary portions of the Cu deposited on the substrate surface are removed by a chemical and mechanical polishing (CMP) process. Such film deposition by plating allows wiring grooves of high aspect ratio to be filled uniformly with Cu of high electrical conductivity. In the CMP process, a semiconductor wafer held by a top ring is pressed against a polishing cloth bonded to the surface of a turntable, and while the wafer is thus held, a polishing solution containing abrasive grains is supplied to the polishing cloth, whereby the Cu layer on the semiconductor wafer is polished both chemically and mechanically.

In polishing a Cu layer by the CMP process it is necessary to selectively remove the Cu layer from the semiconductor substrate while leaving only those portions of the Cu layers filled in the grooves forming Cu wiring. More specifically, portions of the Cu layer deposited in regions other than the grooves forming Cu wiring are required to be removed before the underlying oxide film ($SiO_2$) is exposed. In such a case, if the Cu layer is over-polished to an extent that the portions of the Cu layer in the grooves forming Cu wiring are polished along with the oxide film ($SiO_2$), an undesirable rise in circuit resistance will occur. If this happens, the entire semiconductor substrate becomes waste. Conversely, if the Cu layer is left on the oxide film due to insufficient polishing, adequate circuit separation cannot be accomplished, which may lead to short circuiting. Thus, re-polishing must be performed thereby increasing manufacturing costs.

Figure 9:
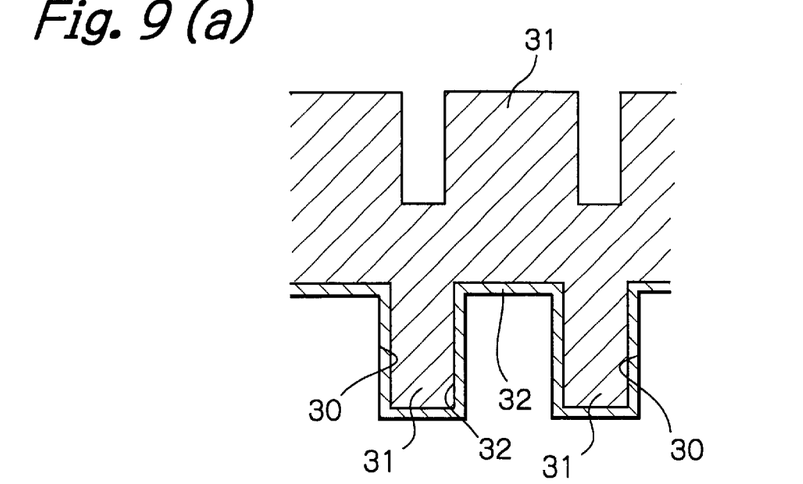
FIGS. 9(a) to 9(c) are schematic views showing the process sequence for forming Cu wiring by the conventional CMP process.

FIGS. 9(a) to 9(c) are schematic views showing a process sequence for forming Cu wiring by the conventional CMP process. As shown in FIG. 9(a), wiring grooves 30 formed in the surface of a semiconductor substrate are filled with a Cu layer 31, and the entire substrate surface is then covered with the Cu layer 31. At this time, the surface of the Cu layer 31 is formed with steps (recesses and projections). In this state, the CMP process is started. As shown in FIG. 9(b), the Cu layer 31 is polished under first polishing conditions in a first polishing step until a barrier metal layer (made of Ta or TaN, for example) 32 is exposed.

Next, as shown in FIG. 9(c), the barrier metal layer 32 is polished under second polishing conditions in a second polishing step to remove the barrier metal until an oxide film ($SiO_2$) 33 is exposed in regions other than portions where the Cu layers 31 are formed in the wiring grooves 30. In such a polishing process, the common practice is to use a slurry (polishing solution) exhibiting a high selectivity ratio of the polish rate (polishing speed) for Cu to that for the barrier metal in the first polishing step. That is, a slurry capable of readily grinding Cu but incapable of readily grinding the barrier metal is used in the first polishing step. The second polishing step uses a slurry (polishing solution) exhibiting a tendency opposite to that of the slurry used in the first polishing step, i.e. a slurry exhibiting a high polish rate (polishing speed) for the barrier metal and a low polish rate for Cu.

The above-described CMP process suffers, however, from some problems. Namely, when a device is polished using the CMP process, if the second polishing step is started when a slight amount of Cu remains on the barrier metal in the first polishing step, Cu cannot be easily or sufficiently removed in the second polishing step. This results in regions other than where a slight amount of Cu remains over-polished. Consequently, an undesirable rise in circuit resistance in the over-polished regions occurs. Such over-polishing occurs as dishing in which Cu wiring portions in grooves are over-polished in a dish-like shape, or oxide erosion in which Cu wiring patterns located proximate to each other separate off, along with the oxide film.

SUMMARY OF THE INVENTION

An object of the present invention is to solve the above-described problems associated with the CMP process and to provide a polishing method and apparatus capable of removing uniformly a Cu layer formed on a substrate, e.g. a semiconductor wafer, and of planarly and uniformly polishing Cu wiring portions formed in fine grooves and/or fine holes formed in the substrate surface without causing overpolishing such as dishing or erosion.

To attain the above-described object, the present invention provides a polishing method for polishing a Cu layer formed on a semiconductor substrate by a chemical and mechanical polishing process to form Cu wiring on the semiconductor substrate. The polishing method includes a first polishing step of preparing a semiconductor substrate having a Cu layer formed so as to fill wiring grooves formed in a surface of the semiconductor substrate and to cover regions of the substrate surface where no wiring groove is formed, and polishing the semiconductor substrate until the Cu layer is polished to a predetermined thickness by bringing the semiconductor substrate into sliding contact with a polishing surface on a turntable. The polishing method further includes a second polishing step of polishing the semiconductor substrate after the first polishing step until the Cu layer formed on the surface of the semiconductor substrate is removed, except for portions of the Cu layer formed to fill the wiring grooves, and a barrier metal layer is also removed by bringing the semiconductor substrate into sliding contact with the polishing surface on the turntable.

In addition, the present invention provides a polishing apparatus for polishing a Cu layer on a semiconductor substrate to form Cu wiring on the semiconductor substrate. The polishing apparatus includes a first turntable having a polishing surface for polishing a semiconductor substrate having a Cu layer formed so as to fill wiring grooves formed in a surface of the semiconductor substrate and to cover regions of the substrate surface where no wiring groove is formed, by bringing the semiconductor substrate into sliding contact with the polishing surface until the Cu layer is polished to a predetermined thickness. A second turntable has a polishing surface for polishing the semiconductor substrate polished with the polishing surface of the first turntable by bringing the semiconductor substrate into sliding contact with the polishing surface of the second turntable until the Cu layer on the surface of the semiconductor substrate is removed, except for portions of the Cu layer formed to fill the wiring grooves, and a barrier metal layer is also removed. The polishing apparatus further includes a sensor for detecting an end point of polishing carried out on the polishing surface of the first turntable and an another sensor for detecting an end point of polishing carried out on the polishing surface of the second turntable.

According to the present invention, at the first polishing step, polishing is carried out until the thickness of the Cu layer formed on the semiconductor substrate reaches a predetermined value. In the first polishing step, only the Cu layer is polished, and the barrier metal layer is not polished. Therefore, during polishing in the first polishing step, the thickness of the Cu layer is continuously measured with a first sensor. When the value detected with the sensor reaches a predetermined threshold value, the first polishing step is terminated.

Next, in the second polishing step, the Cu layer and the barrier metal layer are removed until the underlying oxide film is exposed in regions other than portions where the Cu layer is formed in the wiring grooves. In the second polishing step, both the Cu layer and the barrier metal layer are polished. Therefore, a slurry (polishing solution) exhibiting a low selectivity ratio of polish rate (polishing speed) for Cu to that for the barrier metal is used. During polishing in the second polishing step, the thickness of the Cu layer and the thickness of the barrier metal layer are continuously measured by another sensor. The CMP process is terminated when it is detected by the another sensor that the barrier metal layer has been removed completely. In the second polishing step, a slurry (polishing solution) that also provides a predetermined polish rate (polishing speed) for the oxide film is used so as to remove the barrier metal layer completely.

The above and other objects, features and advantages of the present invention will become more apparent from the following description of the preferred embodiments thereof, taken in conjunction with the accompanying drawings.

BRIEF DESCRIPTION OF THE DRAWINGS

FIGS. 5(a) and 5(b) are graphs showing the result of processing by a controller of a signal detected with an eddy current sensor during polishing of a semiconductor wafer, in which the abscissa axis represents polishing time, and the ordinate axis represents resonance frequency (Hz), of which.

DETAILED DESCRIPTION OF THE INVENTION

Embodiments of the polishing method and apparatus according to the present invention will be described below with reference to the accompanying drawings.

Figure 1:
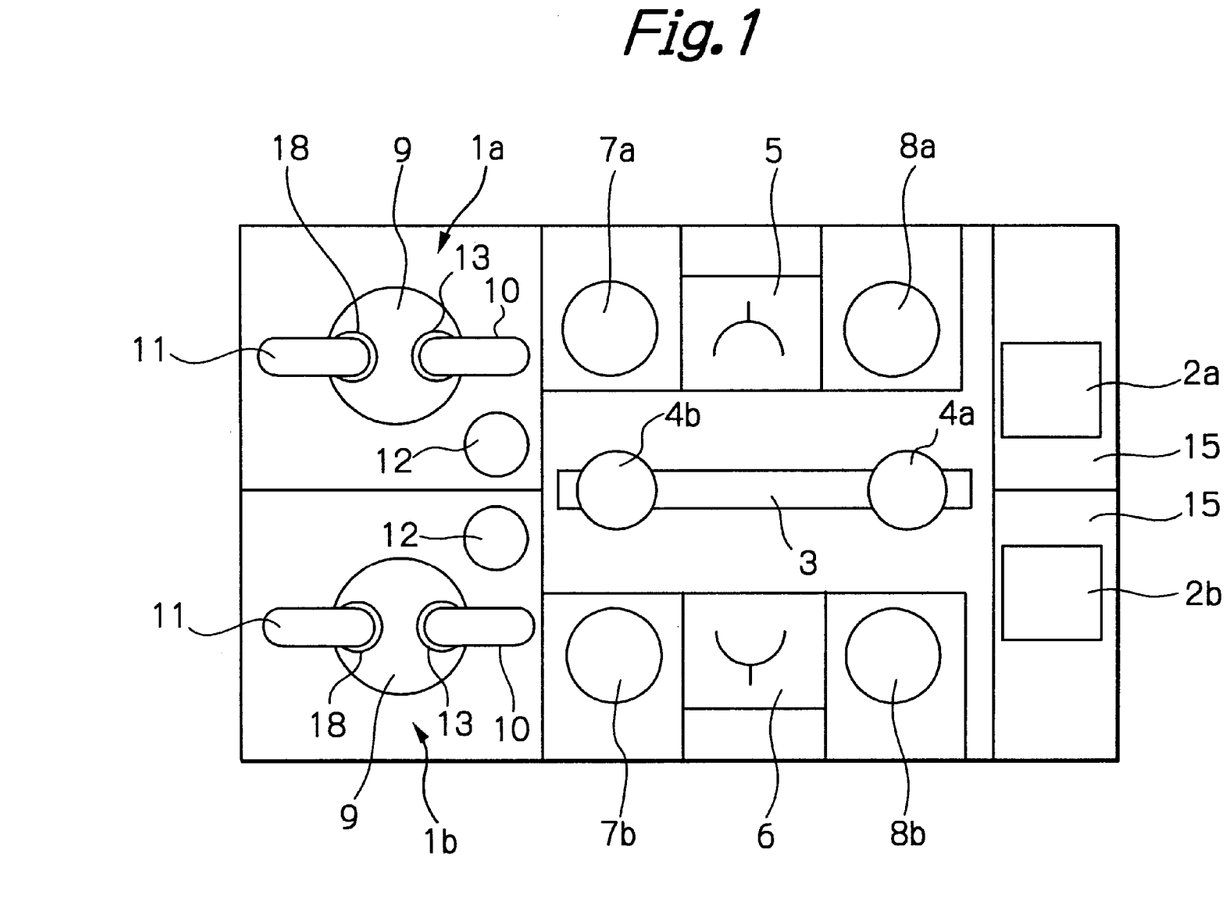
FIG. 1 is a plan view illustrating an embodiment of the polishing apparatus according to the present invention.
Figure 2:
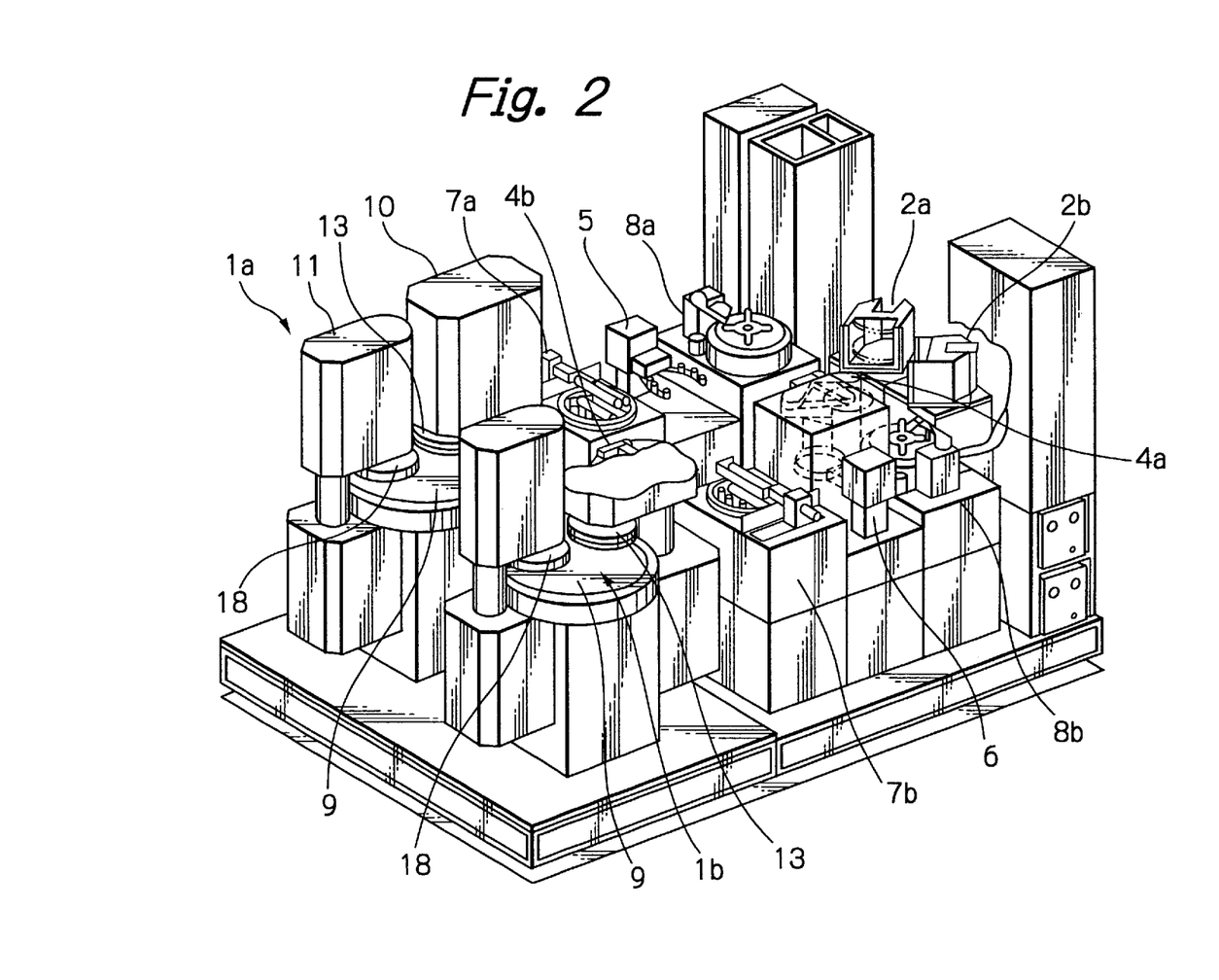
FIG. 2 is a perspective view illustrating the embodiment of the polishing apparatus according to the present invention.

FIGS. 1 and 2 are diagrams illustrating an embodiment of the polishing apparatus according to the present invention. FIG. 1 is a plan view, and FIG. 2 is a perspective view. The apparatus includes a floor with a rectangular shape as a whole, and a pair of polishing units 1a and 1b installed at one end of a space on the floor. The polishing units 1a and 1b are laterally opposed to each other. A pair of load/unload units 15 for mounting semiconductor wafer accommodating cassettes 2a and 2b thereon are installed at the other end of the space on the floor. A traveling rail 3 is laid on an imaginary line connecting the polishing units 1a and 1b and the load/unload units 15. Two transport robots 4a and 4b are provided on the rail 3 to form a transport line between the polishing units 1a and 1b and the load/unload units. A turning-over machine 5 and two cleaning machines 7a and 8a are installed on one side of the transport line. Another turning-over machine 6 and two cleaning machines 7b and 8b are installed on the other side of the transport line.

The two polishing units 1a and 1b have respective devices constructed with basically the same specifications. The devices constituting the polishing units 1a and 1b are disposed in symmetry with respect to the transport line. Each of the polishing units 1a and 1b has a turntable 9 with a polishing cloth bonded to the top surface thereof to form a polishing surface. Each polishing unit further has a top ring head 10 having a top ring 13 adapted to hold a semiconductor wafer under vacuum and to press the semiconductor wafer against the polishing surface on the turntable 9 and a dressing head 11 having a dresser 18 for carrying out dressing of the polishing cloth. Further, the polishing units 1a and 1b have respective pushers 12 provided at sides thereof closer to the transport line to exchange semiconductor wafers between the associated top rings 13 and the pushers. The top rings 13 are capable of swiveling in a horizontal plane. The pushers 12 are vertically movable.

Any type of cleaning machine is usable. For example, the polishing unit-side cleaning machines 7a and 7b are scrub cleaning machines of the type wherein both the obverse and reverse sides of a semiconductor wafer are scrubbed with cleaning devices, e.g. rollers covered with sponge. The cassette-side cleaning machines 8a and 8b are of the type wherein a cleaning liquid is supplied to a semiconductor wafer being rotated in a horizontal plane with its edge held rotatably. The latter cleaning machines also have the function of operating as a centrifugal dryer for drying a semiconductor wafer by centrifugal action. The cleaning machines 7a and 7b can perform primary cleaning of semiconductor wafers. The cleaning machines 8a and 8b can perform secondary cleaning of the semiconductor wafers after the primary cleaning.

The robots 4a and 4b are, for example, of the type wherein an articulated arm capable of bending and stretching in a horizontal plane is provided on the top of a car travelling on the rail 3. The articulated arm has two gripping portions (upper and lower gripping portions) that are used as a dry finger and a wet finger, respectively. Because two robots are used in this embodiment, in operation, the first robot 4a is in charge of works in an area extending from the turning-over machines 5 and 6 toward the cassettes 2a and 2b, and the second robot 4b is in charge of works in an area extending from the turning-over machines 5 and 6 toward the polishing units 1a and 1b.

The turning-over machines 5 and 6 are necessary in this embodiment due to the adopted specific cassette accommodating system and the gripping mechanisms of the robots 4a and 4b. However, the turning-over machines 5 and 6 are not necessary in a case where each semiconductor wafer is transported in a state where the wafer surface to be polished faces downward at all times. The turning-over machines 5 and 6 are also unnecessary in the case of a structure in which the robots 4a and 4b have the function of turning over a semiconductor wafer. In this embodiment, the two turning-over machines 5 and 6 have respective purposes. That is, one of the turning-over machines 5 and 6 is used to handle dry semiconductor wafers. The other of the turning-over machines 5 and 6 is used to handle wet semiconductor wafers.

Figure 3:
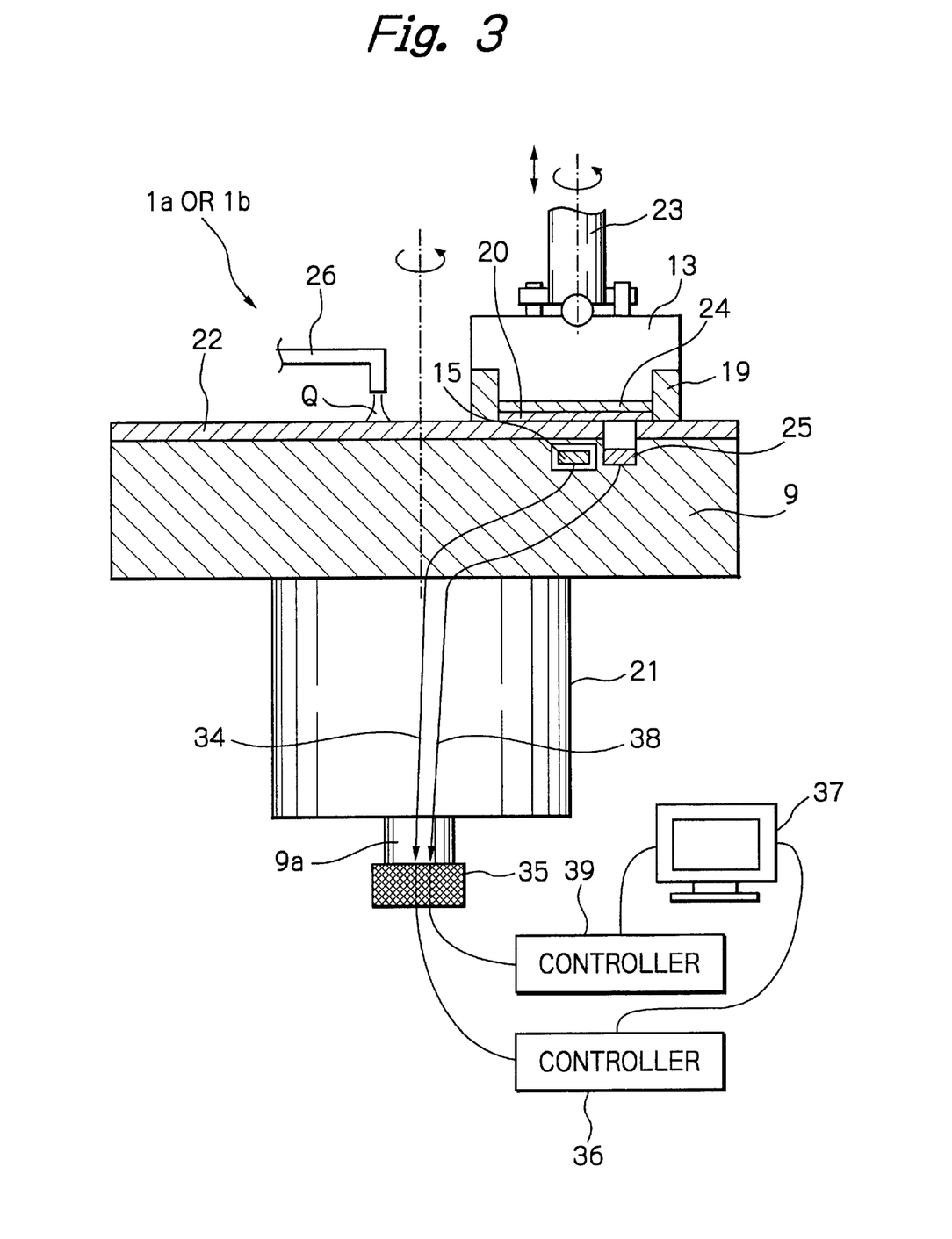
FIG. 3 is a sectional view showing the details of a polishing unit.

FIG. 3 is a detailed sectional view of the polishing unit 1a or 1b. As shown in FIG. 3, the polishing unit 1a or 1b has a turntable 9 and a top ring 13 for holding a semiconductor wafer 20 and pressing it against the turntable 9. The turntable 9 is connected to a motor 21 so as to be rotatable about the axis thereof as shown by the arrow in the figure. A polishing cloth 22 is bonded to the top surface of the turntable 9 to form a polishing surface. The polishing cloth may be a cloth to which abrasive grains are affixed.

The top ring 13 is connected to a motor (not shown) and also connected to an elevating cylinder (not shown). Thus, the top ring 13 is vertically movable and rotatable about the axis thereof as shown by the arrows in the figure, thereby allowing the semiconductor wafer 20 to be pressed against the polishing cloth 22 with a desired pressure. The top ring 13 is connected to a top ring shaft 23. Further, the top ring 13 has an elastic mat 24, e.g. polyurethane, on the bottom surface thereof. A guide ring 19 is provided on the outer periphery of the lower end portion of the top ring 13 to prevent dislocation of the semiconductor wafer 20.

A polishing solution nozzle 26 is installed above the turntable 9 to supply a polishing solution Q onto the polishing cloth 22 bonded to the turntable 9.

As shown in FIG. 3, an eddy current sensor 15 is embedded in the turntable 9. Wiring 34 of the eddy current sensor 15 extends through the turntable 9 and further through a turntable support shaft 9a and is connected to a controller 36 via a rotary connector (or a slip ring) 35 provided on the end of the turntable support shaft 9a. The controller 36 is connected to a display unit 37.

An optical sensor 25 is installed adjacently to the eddy current sensor 15. The optical sensor 25 has a light-projecting device and a light-receiving device. The light-projecting device applies light to the surface to be polished of the semiconductor wafer 20, and the light-receiving device receives reflected light from the surface to be polished. In this case, light emitted from the light-projecting device is a laser beam or light from an LED. Wiring 38 of the optical sensor 25 extends through the turntable 9 and further through the turntable support shaft 9a and is connected to a controller 39 via the rotary connector 35 provided on the end of the turntable support shaft 9a. The controller 39 is connected to the display unit 37.

Figure 4:
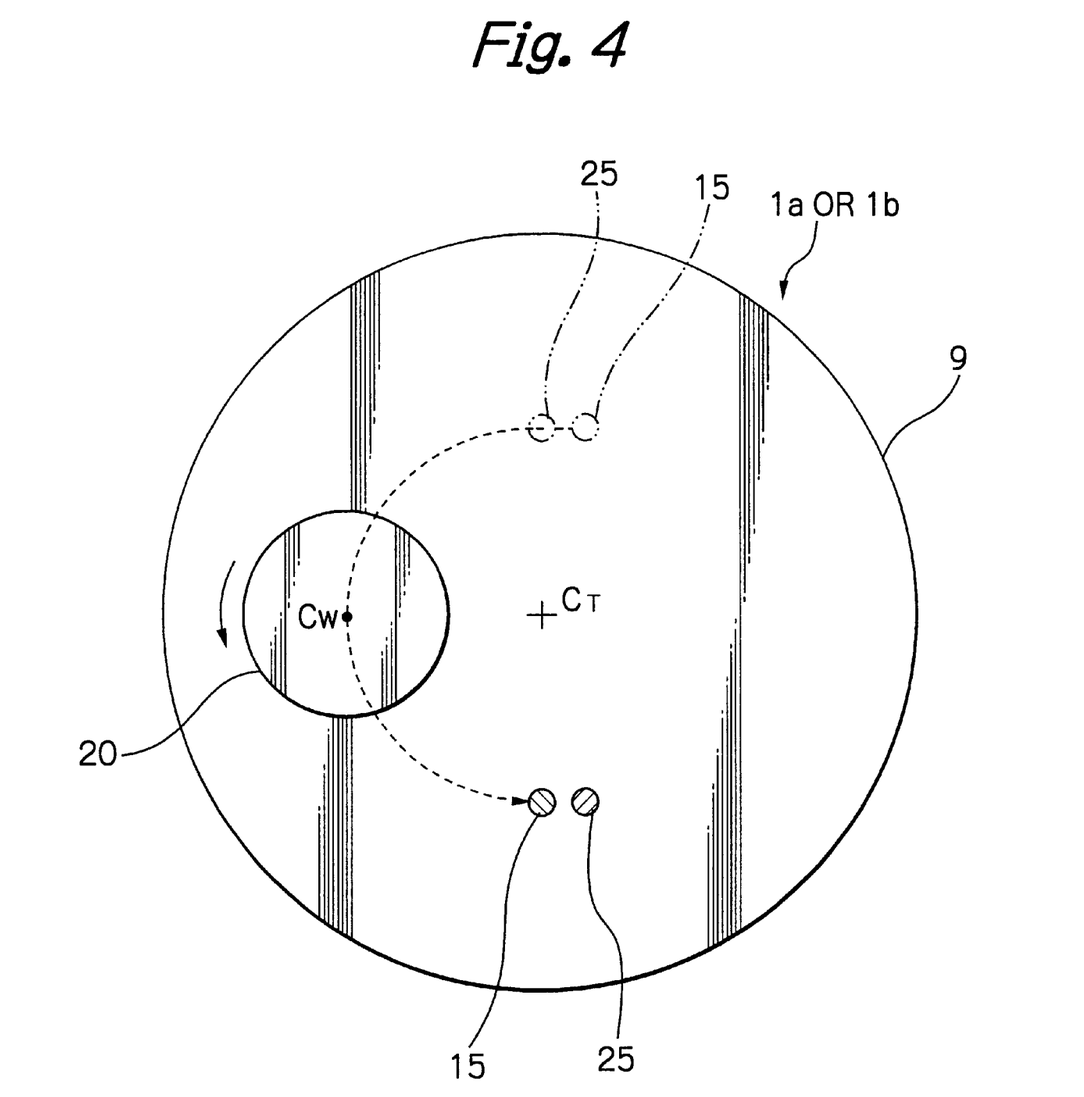
FIG. 4 is a plan view of the polishing unit shown in FIG. 3.

FIG. 4 is a plan view of the turntable 9 of the polishing unit 1a or 1b shown in FIG. 3. As shown in the figure, the eddy current sensor 15 and the optical sensor are installed at respective positions or orbit where the center $C_W$ of the semiconductor wafer 20 being polished while being held by the top ring 13 passes through. Reference symbol $C_T$ denotes the center of rotation of the turntable 9. While passing under the semiconductor wafer 20, the eddy current sensor 15 and the optical sensor 25 are each capable of detecting the thickness of the Cu layer on the semiconductor wafer 20 continuously on the passing locus. To shorten the interval of detection time, another eddy current sensor 15 and another optical sensor 25 may be added as shown by the imaginary lines in FIG. 4. That is, it is possible to provide a plurality of eddy current sensors 15 and a plurality of optical sensors 25 on the turntable 9.

In the polishing apparatus arranged as stated above, a semiconductor wafer 20 is held on the bottom surface of the top ring 13, and the semiconductor wafer 20 is pressed by the action of the elevating cylinder (not shown) against the polishing cloth 22 on the top surface of the rotating turntable 9. Meanwhile, the polishing solution Q is supplied from the polishing solution nozzle 26, whereby the polishing solution Q is retained on the polishing cloth 22. Thus, polishing is carried out in a state where the polishing solution Q is present between the surface (lower surface) to be polished of the semiconductor wafer 20 and the polishing cloth 22. During the polishing process, the eddy current sensor 15 passes directly under the surface being polished of the semiconductor wafer 20 once per revolution of the turntable 9. In this case, the eddy current sensor 15 is installed so as to be in an orbit passing through the center $C_W$ of the semiconductor wafer 20. Therefore, as the eddy current sensor 15 moves upon rotation of the turntable 9, the thickness of the Cu layer on the semiconductor wafer 20 can be detected continuously along the circular orbit of the surface of the semiconductor wafer 20 being polished.

The following is a brief description of the principle of the detection of the thickness of a Cu layer on a semiconductor wafer with the eddy current sensor 15. The system principle of an eddy current process monitor is as follows. A high-frequency electric current is passed through a sensor coil to induce an eddy current in the Cu layer on the wafer. The eddy current changes with changes in the thickness of the Cu layer. Accordingly, the thickness of the Cu layer is detected by monitoring the combined impedance in the sensor circuit. In other words, when a high-frequency electric current is passed through the sensor coil, an eddy current is induced in the Cu layer. Then, the impedance in the circuit is monitored.

Figure 5:
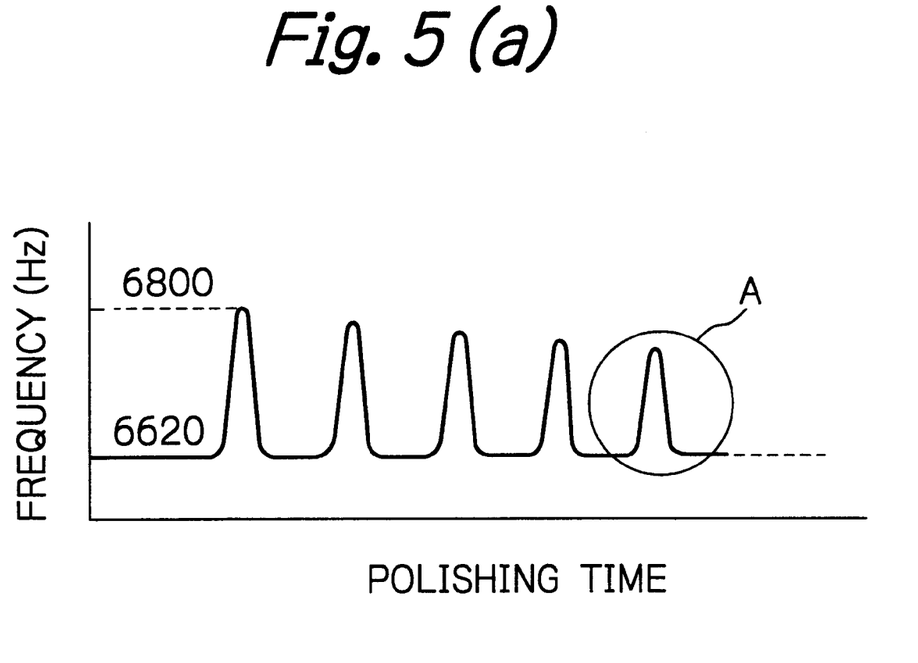
FIG. 5(a) shows changes of the resonance frequency during the time when the eddy current sensor passes directly under the semiconductor wafer a plurality of times during polishing.
FIG. 5(b) is an enlarged view of the portion A in FIG. 5(a).

The impedance in the circuit is expressed in the form of parallel connection of L and C of the sensor unit and R of the Cu layer. In the following expression (1), Z varies as R changes. At this time, the resonance frequency also changes simultaneously. By monitoring the degree of change of the resonance frequency, the end point of the CMP process can be judged.

$$Z = \frac{j\omega L}{(1 - \omega^2 LC) + \frac{j\omega L}{R}} \quad (1)$$

where:
  Z: combined impedance
  j: square root (imaginary number) of −1
  L: inductance
  f: resonance frequency
  C: electrostatic capacity of capacitor
  R: resistive component of Cu layer
  $\omega = 2\rho f$ FIGS. 5(a) and 5(b) are graphs showing the result of processing by the controller 36 of a signal detected with the eddy current sensor 15 during polishing of a semiconductor wafer 20 on the basis of the above-described principle. In the graphs of FIGS. 5(a) and 5(b), the abscissa axis represents polishing time, and the ordinate axis represents resonance frequency (Hz). FIG. 5(a) shows changes of the resonance frequency during the time when the eddy current sensor 15 passes directly under the semiconductor wafer 20 a plurality of times during polishing. FIG. 5(b) is an enlarged view of the portion A in FIG. 5(a). It should be noted that FIGS. 5(a) and 5(b) show the results of detection of the thickness of a Cu layer formed on a semiconductor wafer.

As shown in FIG. 5(a), as polishing progresses, the value obtained by processing the signal from the eddy current sensor 15 in the controller 36 degreases gradually. That is, as the thickness of the Cu layer decreases, the resonance frequency, which is a value obtained by processing the signal from the eddy current sensor 15 in the controller 36, decreases. In FIG. 5(a), the resonance frequency decreases gradually from the initial value, i.e. 6800 (Hz). Accordingly, if the value of resonance frequency when the Cu layer has been fully removed except for the Cu wiring portions is determined in advance, the end point of the CMP process can be detected by monitoring the value of the resonance frequency. In FIG. 5(a), the value of resonance frequency when the Cu layer has been fully removed except for the Cu wiring portions is 6620 (Hz). If the value of resonance frequency obtained when the Cu layer still has a predetermined thickness left (before the polishing end point is reached) is set as a threshold value, the CMP process can be carried out as follows. Polishing is performed under the first polishing conditions until the threshold value is reached. After the threshold value has been reached, polishing is carried out under the second polishing conditions. When the Cu layer and the barrier metal layer have been completely removed to reach the polishing end point, the CMP process is terminated.

The following is a brief description of the principle of the detection of the thickness of a Cu layer on a semiconductor wafer with the optical sensor 25.

During the above-described polishing process, the optical sensor 25 passes directly under the surface being polished of the semiconductor wafer 20 once per revolution of the turntable 9. Accordingly, light from the light-projecting device of the optical sensor 25 passes through the respective openings of the turntable 9 and the polishing cloth 22 to reach the surface being polished of the semiconductor wafer 20. Reflected light from the wafer surface being polished is received by the light-receiving device in the optical sensor 25. In this way, the thickness of the Cu layer on the wafer surface being polished is measured.

The film thickness measuring principle applied to the optical sensor utilizes the interference of light caused by a film under measurement and a medium adjacent to the film. That is, when light is incident on a thin film on a substrate, e.g. a semiconductor wafer, a part of the incident light is reflected by the surface of the film, and the rest of the incident light is transmitted by the film. A part of the transmitted light is reflected by the substrate surface, and the rest of the light is transmitted by the substrate. If the substrate consists of a metal, the transmitted light is absorbed by the substrate. Interference occurs owing to a phase difference between the reflected light from the film surface and the reflected light from the substrate surface. If the two reflected light are in phase with each other, they intensify each other, whereas if they are out of phase with each other, the two reflected light weaken each other. That is, the reflected light intensity varies according to the wavelength of the incident light, the film thickness and the refractive index of the film. Light reflected from the substrate is dispersed by using a diffraction grating or the like, and a profile in which the reflected light intensity at each wavelength is plotted is analyzed to measure the thickness of the film formed on the substrate.

Thus, the polishing apparatus is equipped with two different types of sensors to carry out film thickness measurement as follows. Until the Cu layer becomes a thin film with a predetermined thickness, the thickness of the Cu layer is monitored by processing the signal from the eddy current sensor 15. When the Cu layer has become a thin film with a predetermined thickness so that the thickness of the Cu layer can be detected with the optical sensor 25, the thickness of the thin film is monitored by processing the signal from the optical sensor 25. By doing so, it is possible to accurately detect the fact that the Cu layer has been fully removed except for the Cu wiring portions and hence possible to make a decision about the end point of the CMP process by using the optical sensor 25 which exhibits high measurement sensitivity with respect to a thin film. Needless to say, it is possible to use both the eddy current sensor 15 and the optical sensor 25 jointly until the CMP process reaches the end point. That is, the fact that the Cu layer has become a thin film with a predetermined thickness is detected by monitoring the signals from both the eddy current sensor 15 and the optical sensor 25 that are processed in the respective controllers 36 and 39. Moreover, the fact is detected that the Cu layer has been fully removed except for the Cu wiring portions to enable a decision to be made about the end point of the CMP process by monitoring the signals from both the eddy current sensor 15 and the optical sensor 25, which are processed in the controllers 36 and 39.

Following is a description of a method of forming Cu wiring by using the polishing apparatus arranged as shown in FIGS. 1 to 5(b).

After an oxide film of $SiO_2$ has been deposited over a conductor layer on a semiconductor wafer 20 formed with semiconductor devices or elements, grooves for wiring are formed using lithography and etching techniques. Then, a barrier metal layer of Ta or TaN is formed. Next, a plating process is carried out to fill the wiring grooves with Cu and to form a Cu layer on the oxide film.

Figure 6:
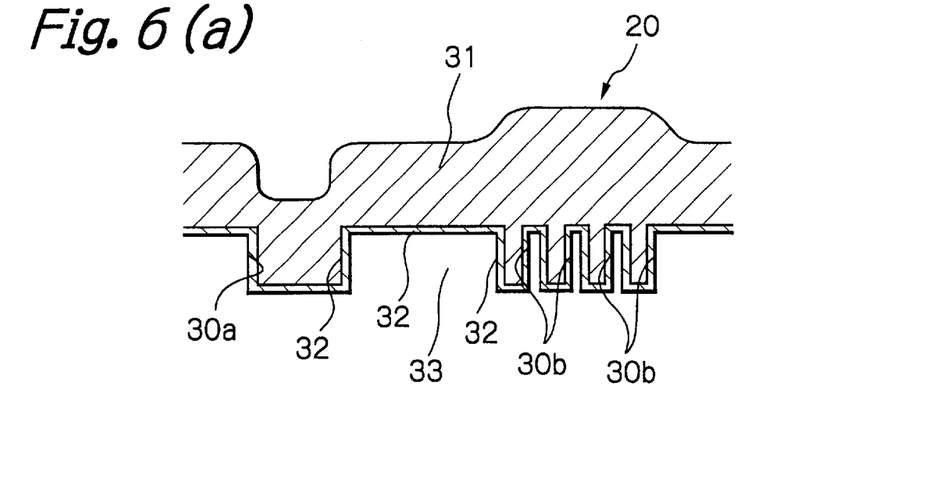
FIGS. 6(a) to 6(c) are schematic views showing the process sequence for forming Cu wiring by a CMP process according to the present invention.

FIG. 6(a) is a diagram showing the semiconductor wafer 20 formed with the Cu layer by the above-described process. FIG. 6(a) shows a state wherein a Cu layer 31 is formed over a part including a wide wiring groove 30a with a line width of 100 micrometers and a plurality of narrow wiring grooves 30b with a line width of 1.5 micrometers formed close to each other at a spacing of 0.5 micrometers. A barrier metal layer 32 is formed to cover the bottom and wall portions of the wiring grooves 30a and 30b and the oxide film ($SiO_2$) 33. The Cu layer 31 is formed on the barrier metal layer 32. Then, the surface of the Cu layer 31 is formed with steps (recesses and projections). The Cu layer 31 is polished by the CMP process to remove the Cu layer 31 and the barrier metal layer 32 until the oxide film 33 is exposed in regions other than the grooves providing Cu wiring. Next, the CMP process will be described below.

First, the flow or movement of a semiconductor wafer during the CMP process executed by using the polishing apparatus shown in FIG. 1 will be described. The flow of a semiconductor wafer is as follows: cassette 2a or 2b43 turning-over machine 5→first polishing unit 1a (first turntable)→cleaning machine 7a→second polishing unit 1b (second turntable)→cleaning machine 7b→turning-over machine 6→cleaning machine 8b→cassette 2a or 2b. The robots 4a and 4b each use a dry finger to handle a dry semiconductor wafer and a wet finger to handle a wet semiconductor wafer. Each pusher 12 receives a semiconductor wafer from the robot 4b and delivers the semiconductor wafer to the top ring 13 by moving upward when the top ring 13 comes to a position directly above it. After being polished, each semiconductor wafer is rinsed by a rinsing liquid supply unit provided at the position of the pusher 12.

In the polishing apparatus shown in FIG. 1, the semiconductor wafer is cleaned at the pusher 12 and the cleaning machine 7a while the semiconductor wafer being separated from the top ring 13. Therefore, by this cleaning operation, it is possible to completely remove the polishing solution used in the first polishing step, together with shavings or debris and so forth, from not only the polished surface of the semiconductor wafer but also from the reverse and side surfaces thereof. After being subjected to the second polishing step, the semiconductor wafer is cleaned by the cleaning machine 7b and the cleaning machine 8b and returned to the cassette 2a or 2b after being spin-dried.

Next, the process sequence for polishing the semiconductor wafer formed with the Cu layer 31, shown in FIG. 6(a), by the CMP process will be described.

First, in the first polishing step carried out by the first polishing unit 1a, the Cu layer 31 is polished until the thickness t of the Cu layer 31 on the semiconductor wafer 20 becomes 500 Å to 2000 Å, as shown in FIG. 6(b). In the first polishing step, only the Cu layer 31 is polished; the barrier metal layer 32 is not polished. Therefore, during polishing in the first polishing step, the thickness of the Cu layer 31 is continuously measured by the eddy current sensor 15 shown in FIG. 3. When the value detected with the eddy current sensor 15 reaches a predetermined threshold value (e.g. a resonance frequency of 6400 to 6500 Hz), the first polishing step is terminated.

Figure 7A:
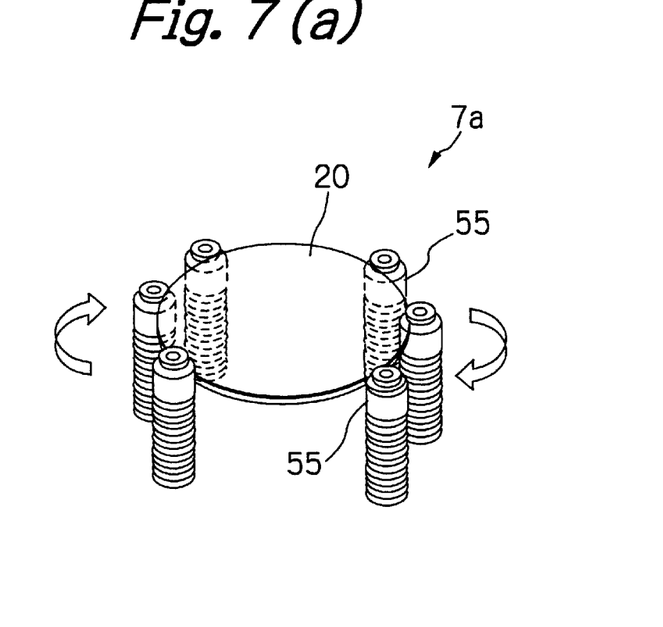
FIG. 7(a) is a perspective view showing the arrangement of a first cleaning machine.
Figure 7B:
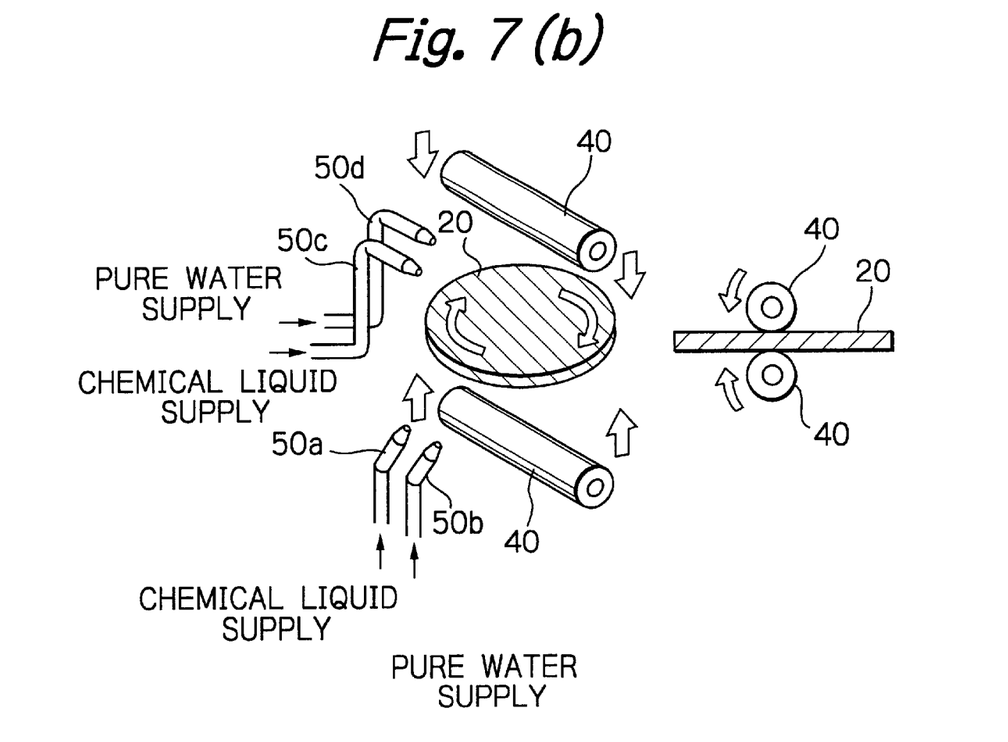
FIG. 7(b) is a diagram showing the operation of the first cleaning machine.

Next, the semiconductor wafer 20 is subjected to the scrub cleaning process by the cleaning machine 7a to remove the polishing solution used for the first polishing step and shavings or debris completely from the semiconductor wafer 20. The cleaning machine 7a is a roll/roll type low-speed rotation cleaning machine arranged as shown in FIGS. 7(a) and 7(b). A plurality of upright rollers 55 for retaining the semiconductor wafer 20 are provided around the semiconductor wafer 20 in such a manner as to be capable of being opened and closed as desired to hold or release the semiconductor wafer 20 by or from the rollers 55. Two roller type cleaning members 40 for scrub cleaning, which are made of sponge or the like, are provided in such a manner as to be able to come in and out of contact with the semiconductor wafer 20 from above and below, respectively. The first cleaning machine 7a is provided with nozzles 50a, 50b, 50c and 50d capable of supplying an etching liquid and pure water to the obverse and reverse sides of the semiconductor wafer 20.

Figure 8:
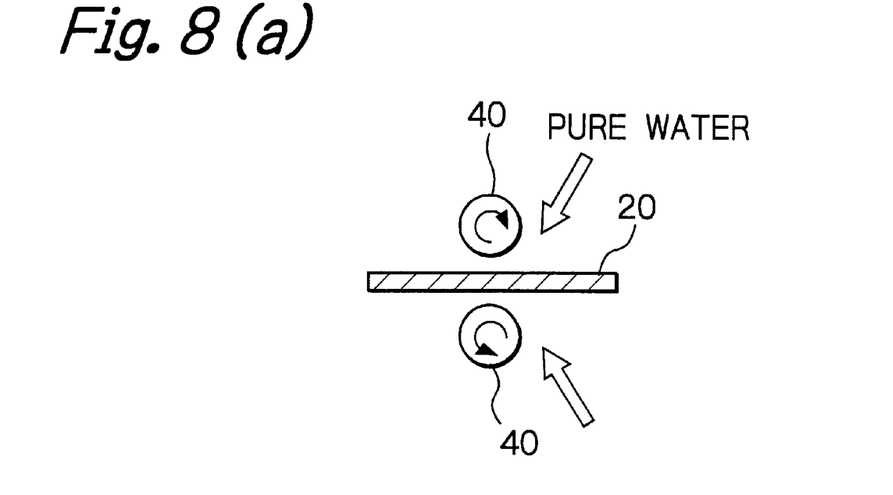
FIGS. 8(a) to 8(c) are diagrams showing the cleaning process carried out by the first cleaning machine.

The semiconductor wafer 20 is subjected to chemical and mechanical polishing and water polishing in the first polishing step by the first polishing unit 1a, whereby most of particles attached to the semiconductor wafer 20 are removed to provide a high degree of cleanliness. The semiconductor wafer 20 polished by the first polishing unit 1a is transferred to the first cleaning machine 7a via the pusher 12 and held with the rollers 55 in such a manner as to be rotatable at a low speed of the order of several tens to 300 rpm, as shown in FIG. 7(a). While pure water is being supplied from the pure water nozzles provided above and below the semiconductor wafer 20 as shown in FIGS. 7(b) and 8(a), the pair of roller sponges (cleaning members) 40 are brought into contact with the upper and lower surfaces of the semiconductor wafer 20 while being rotated around their own axes. In this way, the semiconductor wafer 20 is subjected to scrub cleaning over its entire upper and lower surfaces. Examples of a chemical liquid usable for the scrub cleaning process include a chelate material, a surface-active agent, a mixture of a chelate material and a surface-active agent, and a chelate-surfactant mixture neutralized or alkalified by adjusting the pH.

Next, as shown in FIG. 8(b), the roller sponges 40 are withdrawn from the upper and lower surfaces of the semiconductor wafer 20. Thereafter, an etching liquid is supplied to the upper and lower surfaces of the semiconductor wafer 20 from the chemical liquid nozzles while the rotational speed of the semiconductor wafer 20 is being varied according to need, thereby subjecting the surfaces of the semiconductor wafer 20 to etching (chemical cleaning) to remove metallic ions remaining on the wafer surfaces. Further, as shown in FIG. 8(c), pure water is supplied from the pure water nozzles to effect pure water replacement i.e., replacement of the chemical liquid by the pure water, while the rotational speed of the semiconductor wafer 20 is being varied according to need, thereby removing the remaining etching liquid.

Next, the semiconductor wafer 20 is subjected to the second polishing step by the second polishing unit 1b to remove the Cu layer 31 and the barrier metal layer 32 until the oxide film (SiO$_2$) 33 is exposed in regions other than portions where the Cu layer 31 is formed in the wiring grooves 30a and 30b, as shown in FIG. 6(c). In the second polishing step, both the Cu layer 31 and the barrier metal layer 32 are polished. Therefore, a slurry (polishing solution) exhibiting a low selectivity ratio of the polish rate (polishing speed) for Cu to that for the barrier metal is used. The term "selectivity ratio" as used herein means the ratio between the polish rates (polishing speeds) for respective films under the same polishing conditions, which is expressed in the form of "Cu:Ta:oxide film". During polishing at the second polishing step, the thickness of the Cu layer 31 and the thickness of the barrier metal layer 32 are continuously measured by the optical sensor 25 shown in FIG. 3. The CMP process is terminated when it is detected with the optical sensor 25 that the barrier metal layer 32 has been completely removed. In the second polishing step, a slurry (polishing solution) that also provides a predetermined or specific polish rate (polishing speed) for the oxide film 33 is used to remove the barrier metal layer 32 completely. It should be noted that the first polishing step and the second polishing step may be carried out on the polishing surface of the same turntable.

Following is a description of the actual polishing conditions and polishing results concerning a semiconductor wafer formed with a Cu layer.

As a semiconductor wafer, Sematech Mask 954 was polished by the CMP process. Before being polished, the Cu layer had a thickness of about 1.2 micrometers. Evaluation of dishing and oxide erosion was performed by using a semiconductor wafer having wiring groove of sizes explained before referring to FIG. 6(a).

In the first polishing step, polishing was carried out for 99 seconds by using the alumina-containing slurry (polishing solution) of EPC5001, available from Cabot, and as a polishing cloth IC1000-050(A21)/SUBA400, available from Rodel. The polishing conditions were as follow: The polishing pressure was 3920 N/M$^2$ (400 g/cm$^2$); the rotational speed or rotational number of the turntable was 70 min$^{-1}$; the rotational speed of the top ring was 70 min$^{-1}$; and the air pressure applied to the reverse side of the semiconductor wafer was 1960 N/m$^2$ (200 g/cm$^2$). The steps measured were as follows. Dishing was not more than 50 nanometers at each of the central, intermediate and peripheral portions of the wafer, and oxide erosion was not more than 10 nanometers at each of the central, intermediate and peripheral portions of the wafer. The detection of the end point of the first polishing step was performed with an eddy current sensor. The end point was detected at a frequency of 6400 to 6500 Hz. In this case, the thickness of the remaining Cu film was 500 to 2000 Å. In a case where the thickness of the remaining Cu film becomes 300 Å or less, the film thickness can be measured using an optical sensor.

In the second polishing step, polishing was carried out for 150 seconds by using the slurry of S090(E)-10 (an alkaline polishing solution of pH 9.5 using silica as abrasive grains), available from JSR, and as a polishing cloth IC1000-050 (kgrv)/SUBA400, available from Rodel. The polishing conditions were as follow: The polishing pressure was 3920 N/M$^2$ (400 g/Cm$^2$); the rotational speed or the rotational number, of the turntable was 50 min$^{-1}$; the rotational speed of the top ring was 51 min$^{-1}$; and the air pressure applied to the reverse side of the semiconductor wafer was 980 N/m$^2$ (100 g/cm$^2$). The steps measured were as follows. Dishing was not more than 30 nanometers at each of the central, intermediate and peripheral portions of the wafer, and oxide erosion was not more than 15 nanometers at each of the central, intermediate and peripheral portions of the wafer. The selectivity ratio of the slurry was Cu:Ta:oxide film= 1:0.9:1.4. It is also possible to use Cu10K, available from Arch, as a slurry having such a selectivity ratio. It is more preferable to use a slurry exhibiting a selectivity ratio close to being Cu:Ta:oxide film=1:1:1. If desired, the process may proceed from the first polishing step to the second polishing step after the steps have been removed with a polishing cloth using fixed abrasive grains (abrasive wheel) in the first polishing step. The end point detection for the second polishing step should preferably be performed using the above-described optical sensor.

Because the slurry used in the first polishing step contains alumina particles and the slurry used in the second polishing step contains silica particles, the semiconductor wafer inevitably is required to pass through a scrub cleaning machine in being moved to the second polishing step to remove particles from the semiconductor wafer. By polishing the oxide film in the second polishing step, the amount of dishing and erosion can be reduced. Consequently, it becomes possible to form a film on the oxide film with a high degree of accuracy because the surface of the semiconductor wafer is flat.

As has been stated above, the polishing method and apparatus according to the present invention are capable of uniformly removing a Cu layer formed on a substrate, e.g. a semiconductor wafer, and of planarly and uniformly polishing Cu wiring portions formed in fine grooves and/or fine holes formed on the substrate surface without giving rise to problems of over-polishing such as dishing or erosion.

It should be noted that the present invention is not necessarily limited to the foregoing embodiments, and various modifications are possible.

What is claimed is:

1. A method for polishing a copper layer on a substrate, comprising:

providing a substrate having a copper layer on a surface thereof;

first polishing said copper layer;

stopping the first polishing when an eddy current sensor determines that said copper layer has been polished to a predetermined thickness;

second polishing said copper layer; and stopping the second polishing when an optical sensor determines that said copper layer has been removed from said surface.

2. The method according to claim 1, wherein providing a substrate having a copper layer on a surface thereof comprises providing a semiconductor substrate having grooves in a surface thereof, such that copper is on said surface and in said grooves of said semiconductor substrate, first polishing said copper layer comprises first chemically mechanically polishing said copper layer by bringing said copper layer into sliding contact with a polishing surface on a polishing tool, second polishing said copper layer comprises second chemically mechanically polishing said copper layer by bringing said copper layer into sliding contact with a polishing surface on a polishing tool, and stopping the second polishing when an optical sensor determines that said copper layer has been removed from said surface comprises stopping the second chemically mechanically polishing when said optical sensor determines that said copper has been removed from said surface of said semiconductor substrate but not from said grooves, whereby said copper in said grooves defines wiring on said semiconductor substrate.

3. The method according to claim 2, further comprising:

providing a barrier metal layer on said surface of said semiconductor substrate such that said copper is on said barrier metal layer, wherein stopping the second chemically mechanically polishing when said optical sensor determines that said copper has been removed from said surface of said semiconductor substrate but not from said grooves comprises stopping the second chemically mechanically polishing when said optical sensor determines that said copper and said barrier metal layer have been removed from said surface of said semiconductor substrate.

4. The method according to claim 3, wherein first chemically mechanically polishing said copper layer by bringing said copper layer into sliding contact with a polishing surface on a polishing tool includes supplying a first polishing liquid to said polishing surface, and second chemically mechanically polishing said copper layer by bringing said copper layer into sliding contact with a polishing surface on a polishing tool includes supplying a second polishing liquid to said polishing surface, with said first polishing liquid being different than said second polishing liquid.

5. The method according to claim 4, further comprising:

cleaning said semiconductor substrate between the first chemically mechanically polishing and the second chemically mechanically polishing.

6. The method according to claim 4, wherein providing a barrier metal layer on said surface of said semiconductor substrate comprises providing a layer of one of Ta and TaN on said surface of said semiconductor substrate.

7. The method according to claim wherein providing a barrier metal layer on said surface of said semiconductor substrate comprises providing said barrier metal layer on an oxide film, and stopping the second chemically mechanically polishing comprises continuing the second chemically mechanically polishing until said oxide film is exposed.

8. The method according to claim 7, wherein providing said barrier metal layer on an oxide film comprises providing said barrier layer on a film of $SiO_2$.

9. The method according to claim 3, wherein stopping the first polishing when an eddy current sensor determines that said copper layer has been polished to a predetermined thickness comprises stopping the first chemically mechanically polishing when said eddy current sensor determines that said copper on said barrier metal layer has been polished to a thickness within a range of 500 A to 2000 A.

10. The method according to claim 3, wherein stopping the first polishing when an eddy current sensor determines that said copper layer has been polished to a predetermined thickness comprises stopping the first chemically mechanically polishing when a resonance frequency of said eddy current sensor reaches a predetermined threshold value.

11. The method according to claim 10, wherein stopping the first chemically mechanically polishing when a resonance frequency of said eddy current sensor reaches a predetermined threshold value comprises stopping the first chemically mechanically polishing when a resonance frequency of said eddy current sensor reaches a value within a range of from 6400 Hz to 6500 Hz.

12. The method according to claim 3, wherein stopping the second chemically mechanically polishing when said optical sensor determines that said copper layer and said barrier metal layer have been removed from said surface of said semiconductor substrate comprises operating said optical sensor to utilize dispersal of light reflected from said semiconductor substrate to determine when said copper layer and said barrier metal layer have been removed from said surface of said semiconductor substrate.

13. The method according to claim 12, wherein operating said optical sensor to utilize dispersal of light reflected from said semiconductor substrate to determine when said copper layer and said barrier metal layer have been removed from said surface of said semiconductor substrate includes causing the dispersal of light via a diffraction grating.

14. The method according to claim 3, wherein first chemically mechanically polishing said copper layer by bringing said copper layer into sliding contact with a polishing surface on a polishing tool includes supplying a first polishing solution to said polishing surface, and second chemically mechanically polishing said copper layer by bringing said copper layer into sliding contact with a polishing surface on a polishing tool includes supplying a second polishing solution to said polishing surface, with said first polishing solution and said second polishing solution each having different polishing rates for copper and an oxide film.

15. The method according to claim 3, wherein first chemically mechanically polishing said copper layer by bringing said copper layer into sliding contact with a polishing surface on a polishing tool includes supplying a first polishing solution to said polishing surface, and second chemically mechanically polishing said copper layer by bringing said copper layer into sliding contact with a polishing surface on a polishing tool includes supplying a second polishing solution to said polishing surface, with said first polishing solution and said second polishing solution each having different polishing rates for copper and tantalum.

16. An apparatus for polishing a copper layer on a semiconductor substrate to form copper wiring on the semiconductor substrate, said apparatus comprising:

a first polishing tool having a polishing surface for first polishing a copper layer, which layer includes copper on a barrier metal layer that is in grooves and on a surface of a semiconductor substrate in which the grooves are formed, by bringing the copper layer into sliding contact with said polishing surface;

an eddy current sensor for determining when the copper layer has been polished by said first polishing tool to a predetermined thickness so as to stop the first polishing of the copper layer;

a second polishing tool having a polishing surface for second polishing the copper layer after stoppage of the first polishing of the copper layer, by bringing the copper layer into sliding contact with said polishing surface of said second polishing tool; and an optical sensor for determining when the copper and the barrier metal layer have been removed by said second polishing tool from the surface of the semiconductor substrate, but not from the grooves, so as to stop the second polishing of the copper layer.

17. The apparatus according to claim 16, wherein the barrier metal layer comprises a layer of one of Ta and TaN.

18. The apparatus according to claim 16, wherein the barrier metal layer is on an oxide film, and said optical sensor is for determining when the copper and the barrier metal layer have been removed such that the second polishing is continued until the oxide film is exposed.

19. The apparatus according to claim 18, wherein the oxide film comprises a film of $SiO_2$.

20. The apparatus according to claim 16, wherein said eddy current sensor is for determining when the copper layer has been polished by said first polishing tool to a thickness within a range of 500 A to 2000 A.

21. The apparatus according to claim 16, wherein said eddy current sensor is for determining when the copper layer has been polished by said first polishing tool to a predetermined thickness by indicating when a resonance frequency of said eddy current sensor reaches a predetermined threshold value.

22. The apparatus according to claim 16, wherein said optical sensor is for determining when the copper and the barrier metal layer have been removed by said second polishing tool from the surface of said semiconductor substrate, but not from the grooves, by utilizing dispersal of light reflected from said semiconductor substrate.

23. The apparatus according to claim 22 further comprising a diffraction grating for conducting the dispersal of light reflected from the semiconductor substrate.

24. The apparatus according to claim 16, wherein said first polishing tool is for first polishing the copper layer by bringing the copper layer into sliding contact with said polishing surface while a first polishing solution is supplied to said polishing surface, and said second polishing tool is for second polishing the copper layer by bringing the copper layer into sliding contact with said polishing surface while a second polishing solution is supplied to said polishing surface, with the first polishing solution and the second polishing solution each having different polishing rates for copper and an oxide film.

25. The apparatus according to claim 24, wherein said first polishing tool is for first polishing the copper layer by bringing the copper layer into sliding contact with said polishing surface while a first polishing solution is supplied to said polishing surface, and said second polishing tool is for second polishing the copper layer by bringing the copper layer into sliding contact with said polishing surface while a second polishing solution is supplied to said polishing surface, with the first polishing solution and the second polishing solution each having different polishing rates for copper and tantalum.

26. An apparatus for polishing a substrate, comprising:

a polishing tool providing a polishing surface;

a top ring for holding a substrate while the substrate is in contact with and moved relative to said polishing surface so as to polish the substrate;

a first sensor to measure a film thickness of the substrate; and a second sensor to measure a film thickness of the substrate, wherein said first sensor is of a type that is different than that of said second sensor.

27. The apparatus according to claim 26, wherein said first sensor is provided at a first position on a polishing surface side of said polishing tool such that while the substrate is moved relative to said polishing surface, during polishing of the substrate, a center of the substrate passes through said first position; and said second sensor is provided at a second position on a polishing surface side of said polishing tool such that while the substrate is moved relative to said polishing surface, during polishing of the substrate, a center of the substrate passes through said second position.

28. The apparatus according to claim 27, wherein said first sensor comprises an optical thickness by emitting a light to the substrate.

29. The apparatus according to claim 28, wherein said second sensor comprises an eddy current sensor for measuring the film thickness by inducing an eddy current in a layer on the substrate.

30. The apparatus according to claim 27, wherein said first sensor comprises an eddy current sensor for measuring the film thickness by inducing an eddy current in a layer on the substrate.

* * * * *